(12) United States Patent
Takeda et al.

(10) Patent No.: US 6,859,307 B2
(45) Date of Patent: Feb. 22, 2005

(54) METHOD AND DEVICE FOR WAVEFORM SHAPING OF SIGNAL LIGHT

(75) Inventors: Shinichi Takeda, Kawasaki (JP); Shigeki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/803,978

(22) Filed: Mar. 13, 2001

(65) Prior Publication Data

US 2002/0003653 A1 Jan. 10, 2002

(30) Foreign Application Priority Data

Jul. 4, 2000 (JP) .......................... 2000-201984

(51) Int. Cl.[7] .................... H01S 3/00; H04B 10/02
(52) U.S. Cl. ...................... 359/337; 398/175
(58) Field of Search ................ 359/337, 341.4–341.42, 359/337.13; 398/175

(56) References Cited

U.S. PATENT DOCUMENTS

| 5,396,059 A | * | 3/1995 | Yeates ................... 250/214 C |
| 5,491,576 A | * | 2/1996 | Bergano ..................... 398/185 |
| 5,959,766 A | * | 9/1999 | Otterbach et al. .......... 359/337 |
| 6,067,180 A | * | 5/2000 | Roberts ....................... 398/201 |
| 6,317,232 B1 | * | 11/2001 | Fee et al. ........................ 398/9 |
| 6,323,993 B1 | * | 11/2001 | Hansen et al. .............. 359/337 |
| 6,396,607 B1 | * | 5/2002 | Cao ............................ 398/154 |
| 6,532,087 B1 | * | 3/2003 | Ransford et al. .............. 398/5 |
| 2001/0005276 A1 | * | 6/2001 | Edagawa et al. ........... 359/326 |
| 2001/0021288 A1 | * | 9/2001 | Watanabe et al. ............. 385/15 |

FOREIGN PATENT DOCUMENTS

JP 06083143 B2 10/1994 ........... H04B/10/04

* cited by examiner

*Primary Examiner*—Mark Hellner
*Assistant Examiner*—Deandra M. Hughes
(74) *Attorney, Agent, or Firm*—Staas & Halsey LLP

(57) ABSTRACT

Disclosed herein is a method and device for waveform shaping of signal light. The method includes the steps of providing a waveform shaper for waveform shaping input signal light and outputting output signal light, measuring the quality of the output signal light, and controlling the power of the input signal light so that the quality measured is improved. According to this method, a substantially optimum threshold can be obtained to allow a good regenerating operation.

29 Claims, 14 Drawing Sheets

FIG. 3A PRIOR ART — LINEAR TYPE
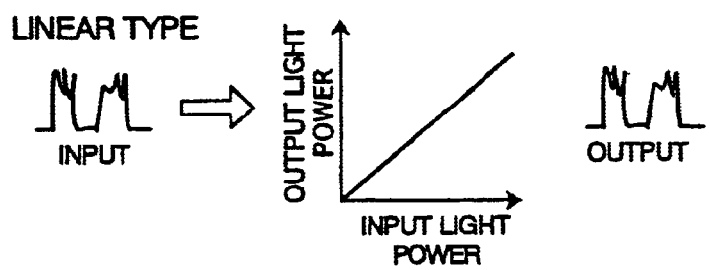
FIG. 3B PRIOR ART — DIGITAL TYPE
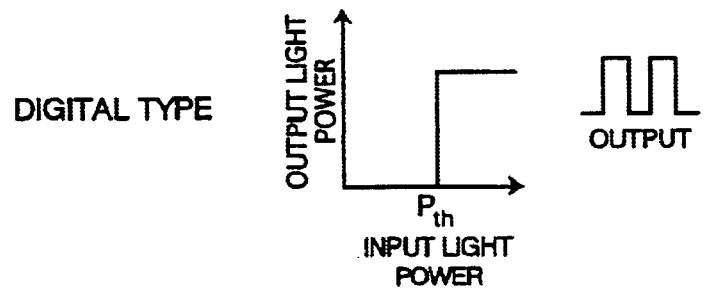
FIG. 3C PRIOR ART — INTERFERENCE TYPE
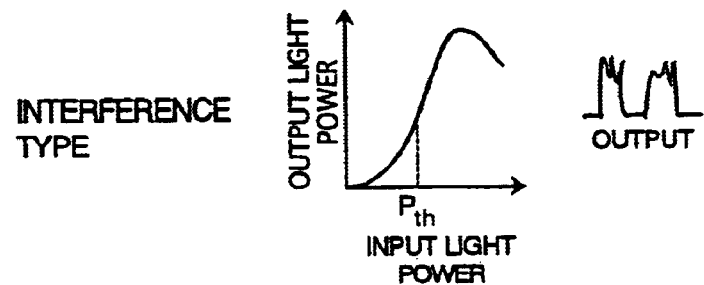
FIG. 3D PRIOR ART — LIMITER TYPE
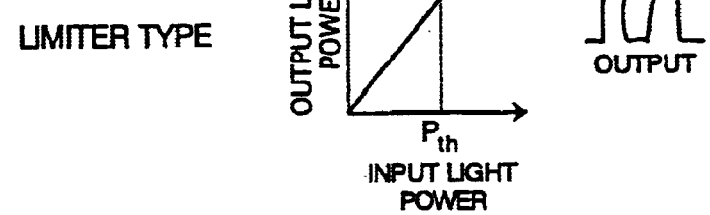
FIG. 3E PRIOR ART — ABSORPTION TYPE
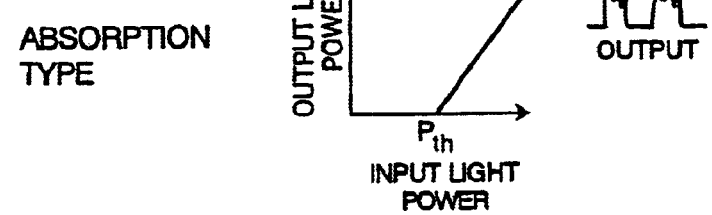

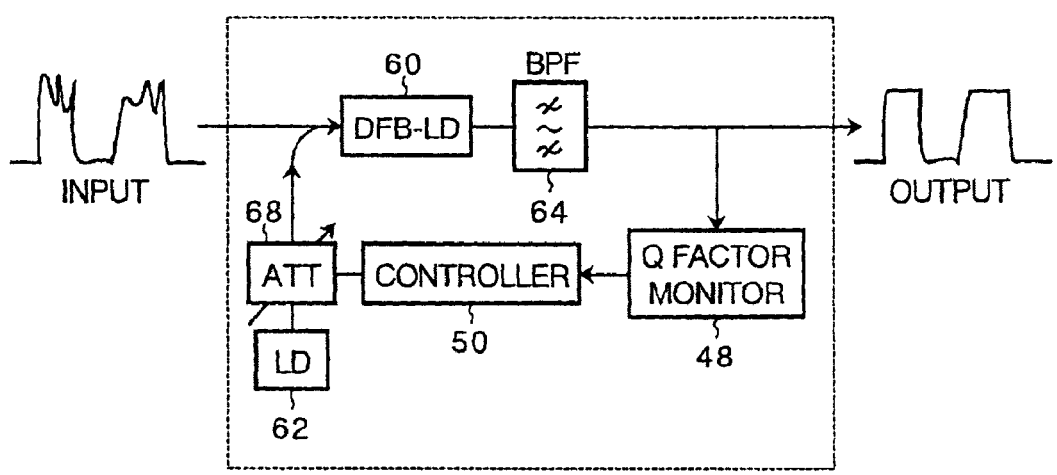
F I G. 1 8

METHOD AND DEVICE FOR WAVEFORM SHAPING OF SIGNAL LIGHT

CROSS-REFERENCE TO RELATED APPLICATION

This application relates to U.S. application Ser. Nos. 09/217,018, 09/571,384, 09/637,640, and 09/665,164, and which are incorporated herein by reference.

This application is based on, and claims priority to, Japanese application number 2000-201984, filed on Jul. 4, 2000, in Japan, and which is incorporated herein by reference.

BACKGROUND OF THE INVENTION

1. Field of the Invention

The present invention relates to a method and device for waveform shaping of signal light.

2. Description of the Related Art

A Mach-Zehnder interferometer (MZI) type optical gate is known as a conventional waveform shaping device for performing waveform shaping at the optical level. This optical gate is configured by integrating a Mach-Zehnder interferometer including first and second nonlinear optical media each for providing a phase shift on an optical waveguide substrate, for example. Probe light as continuous wave (CW) light is equally divided into two components, which are in turn supplied to the first and second nonlinear optical media. The optical path length of the interferometer is set so that output light is not obtained by interference of the two components of the probe light.

An optical signal is further supplied to one of the first and second nonlinear optical media. By properly setting the powers of the optical signal and the probe light, a converted optical signal synchronous with the optical signal is output from the optical gate. The converted optical signal has the same wavelength as that of the probe light.

It has been proposed to use a semiconductor optical amplifier (SOA) as each of the first and second nonlinear optical media. For example, an InGaAs—SOA having opposite end faces treated with antireflection coatings is used as each nonlinear optical medium in a 1.5 $\mu$m band, and these nonlinear optical media are integrated on an InP/GaInAsP substrate to fabricate an optical gate.

A nonlinear optical loop mirror (NOLM) is known as another conventional waveform shaping device. The NOLM includes a first optical coupler including first and second optical paths directionally coupled to each other, a loop optical path for connecting the first and second optical paths, and a second optical coupler including a third optical path directionally coupled to the loop optical path.

By forming a part or the whole of the loop optical path from a nonlinear optical medium and supplying probe light and an optical signal respectively to the first optical path and the third optical path, a converted optical signal is output from the second optical path.

An optical fiber is generally used as the nonlinear optical medium in the NOLM. In particular, a NOLM using a SOA as the nonlinear optical medium is referred to as a SLALOM (Semiconductor Laser Amplifier in a Loop Mirror).

In an optical fiber communication system that has been put to practical use in recent years, a reduction in signal power due to transmission line loss, coupling loss, etc. is compensated by using an optical amplifier such as an erbium doped fiber amplifier (EDFA). The optical amplifier is an analog amplifier, which functions to linearly amplify a signal. In this kind of optical amplifier, amplified spontaneous emission (ASE) noise generated in association with the amplification is added to cause a reduction in signal-to-noise ratio (S/N ratio), so that the number of repeaters is limited to result in the limit of a transmission distance. Further, waveform degradation due to the chromatic dispersion owned by an optical fiber and the nonlinear optical effects in the fiber is another cause of the transmission limit. To break down such a limit, a regenerative repeater for digitally processing a signal is required, and it is desirable to realize such a regenerative repeater. In particular, an all-optical regenerative repeater capable of performing all kinds of signal processing at the optical level is important in realizing a transparent operation independent of the bit rate, pulse shape, etc. of a signal.

The functions required for the all-optical regenerative repeater are amplitude restoration or reamplification, waveform shaping or reshaping, and timing restoration or retiming. These functions are referred to as 3R functions, and in particular, the first and second functions are referred to as 2R functions.

The 2R functions can be provided by combining a waveform shaper and an optical amplifier, or by using a waveform shaper having an optical amplifying function. Further, the 3R functions can be provided by additionally using a clock regenerator in parallel to the 2R functions.

By combining an opto-electrical converter, a discriminating circuit, and an electro-optical converter, it is possible to provide a regenerative repeater for performing waveform shaping in the electrical domain. In this kind of regenerative repeater, a threshold can be changed by changing a set value of a reference voltage in the discriminating circuit.

However, in an all-optical regenerative repeater, it is not easy to change a threshold. For example, in the above-mentioned NOLM, a transfer function is determined according to a fiber length and a nonlinear coefficient, so that when an optical fiber is given as the nonlinear medium, the threshold in its input-output characteristic is determined uniquely and it cannot be changed. Accordingly, the threshold is not always an optimum threshold for signal light supplied, and there is a possibility that the regenerating operation may become incomplete.

SUMMARY OF THE INVENTION

It is therefore an object of the present invention to provide a method and device for waveform shaping which can obtain a substantially optimum threshold to allow a good regenerating operation.

Other objects of the present invention will become apparent from the following description.

In accordance with a first aspect of the present invention, there is provided a method comprising the steps of providing a waveform shaper for waveform shaping input signal light and outputting output signal light; measuring the quality of the output signal light; and controlling the power of the input signal light so that the quality measured is improved.

In this method, the power of the input signal light to be supplied to the waveform shaper is controlled so that the measured quality of the output signal light (e.g., a corresponding Q factor or bit error rate) is improved. Accordingly, a substantially optimum threshold for the input signal light can be obtained in the waveform shaper, thereby allowing a good regenerating operation.

In accordance with a second aspect of the present invention, there is provided a device comprising a waveform shaper for waveform shaping input signal light and outputting output signal light; means for measuring the quality of the output signal light; and a power controller for controlling the power of the input signal light so that the quality measured is improved.

In accordance with a third aspect of the present invention, there is provided a method comprising the steps of providing a waveform shaper having a variable threshold for waveform shaping input signal light according to the variable threshold and outputting output signal light; measuring the quality of the output signal light; and controlling the variable threshold so that the quality measured is improved.

In accordance with a fourth aspect of the present invention, there is provided a device comprising a waveform shaper having a variable threshold for waveform shaping input signal light according to the variable threshold and outputting output signal light; means for measuring the quality of the output signal light; and a controller for controlling the variable threshold so that the quality measured is improved.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 3A to 3E are graphs showing the characteristics of various optical devices each usable as an optical regenerator or its component;

FIG. 18 is a block diagram showing a ninth preferred embodiment of the device according to the present invention.

DETAILED DESCRIPTION OF THE PREFERRED EMBODIMENTS

Figure 1:
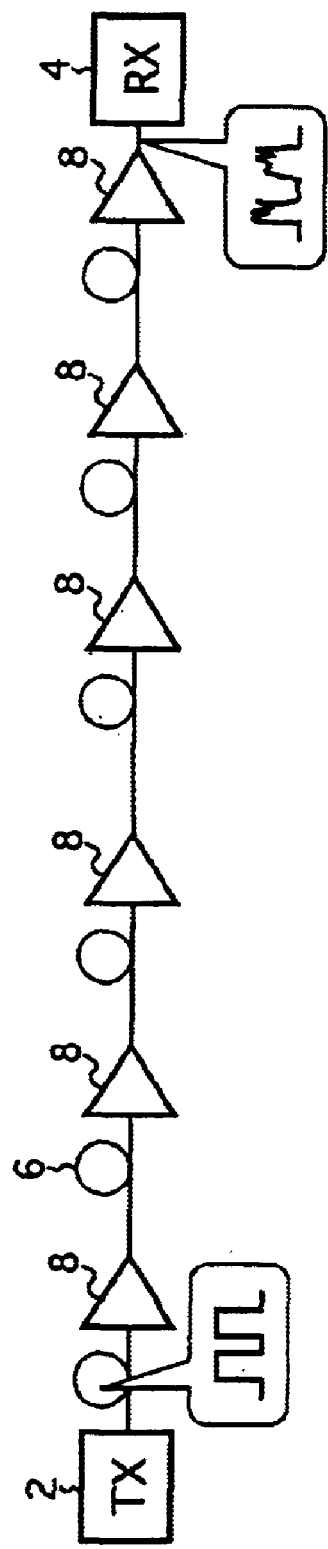
FIG. 1 is a block diagram of a system to which the present invention is applicable.

Some preferred embodiments of the present invention will now be described in detail with reference to the attached drawings. Throughout the drawings, substantially the same or like parts are denoted by the same reference numerals.

FIG. 1 is a block diagram of a system to which the present invention is applicable. An optical fiber transmission line 6 is laid between an optical transmitter (TX) 2 and an optical receiver (RX) 4. A plurality of linear amplifiers 8 each configured by using an optical fiber amplifier or the like are arranged along the optical fiber transmission line 6.

In this kind of linear amplification repeater system, each linear amplifier 8 substantially linearly amplifies an input signal waveform, so that ASE noise generated in each linear amplifier 8 and waveform distortion generated by dispersion and/or nonlinear effects in the optical fiber transmission line 6 are accumulated according to a transmission distance, causing a large degradation in signal quality. As a result, the transmission distance is limited, thus making one of limitation factors in designing the system.

Figure 2:
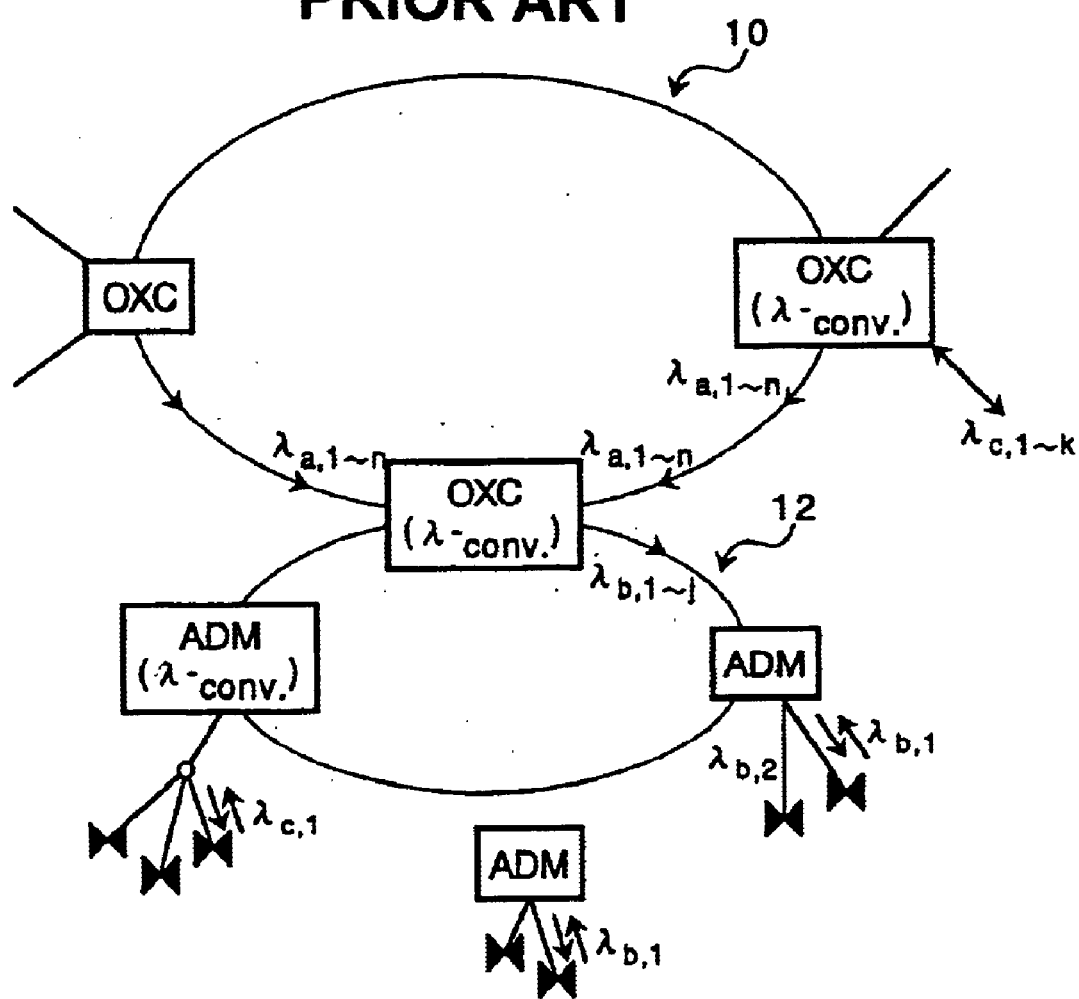
FIG. 2 is a block diagram of another system to which the present invention is applicable.

FIG. 2 is a block diagram of another system to which the present invention is applicable. This system is intended to support a so-called photonic network scheduled to come into commercial service in the near future. A first network 10 and a second network 12 are mutually connected by an optical cross-connect OXC. Other optical cross-connects OXCs are provided to connect the first network 10 to other networks. Further, a plurality of add/drop multiplexers (ADM) are provided to connect the second network 12 to subscriber terminals or nodes.

In this kind of photonic network, signal branching/insertion, wavelength conversion, etc. are performed in the optical domain without opto-electrical conversion and electro-optical conversion. To compensate for optical power loss in this processing, the optical signal is amplified by an optical amplifier (not shown). Accordingly, there occurs a problem of degradation in optical SNR (signal-to-noise ratio) due to ASE noise, causing a possibility of limitation to the scale of the network.

To solve these problems, it is desirable to adopt an optical regenerator for suppressing or removing noise in an optical signal or performing waveform shaping of the optical signal, thereby improving a signal quality. In particular, it is strongly desirable to provide an optical regenerator without opto-electrical conversion and electro-optical conversion.

FIGS. 3A to 3E are graphs showing the characteristics of various optical devices each usable as an optical regenerator or its component.

FIG. 3A shows the input-output characteristic of an optical fiber amplifier widely used at present. In this case, linear amplification is performed, so that the waveform of an input signal is substantially the same as that of an output signal, and a noise suppression effect is not exhibited.

FIG. 3B shows the input-output characteristic of an ideal digital optical regenerator. In this case, the noises at the space and mark levels of a signal can be limited to a constant value, so that a waveform with noise completely suppressed can be regenerated. However, such an optical regenerator having a sufficient characteristic has not yet been put to practical use, but a regenerator for performing waveform shaping in the electrical domain as shown in FIG. 4 is actually used.

Figure 4:
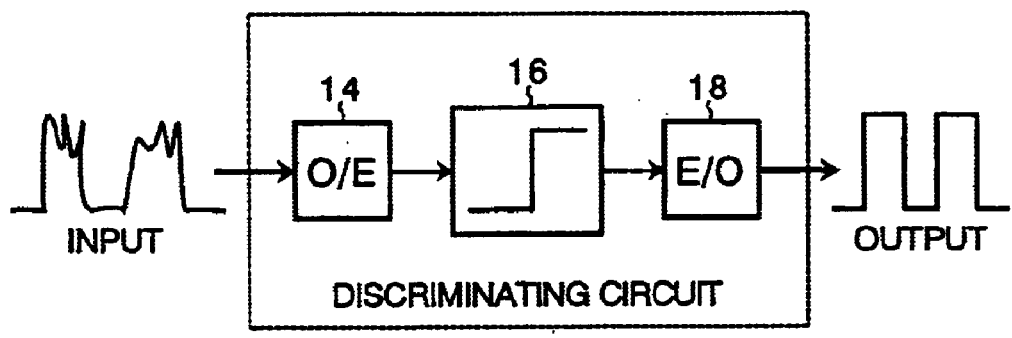
FIG. 4 is a block diagram of a regenerator for performing waveform shaping in the electrical domain.

FIG. 4 is a block diagram of a regenerator for performing waveform shaping in the electrical domain. This regenerator includes an opto-electrical converter (O/E) 14 for accepting input signal light accompanied by noise, a discriminating circuit 16 for accepting an output from the opto-electrical converter 14, and an electro-optical converter (E/O) 18 for accepting an output from the discriminating circuit 16. In this regenerator, the transmission speed that can be covered is limited by a speed in the electrical domain, so that it is difficult to apply this regenerator to a very high-speed signal, and the high-speed performance of light cannot be exploited. Further, the opto-electrical conversion causes not only an enlargement in scale of the device, but also the generation of slight delay. Accordingly, in a very long-haul transmission system including such regenerators cascaded in tens of stages as repeaters, there is a possibility that the accumulated delay may become so large as not to be negligible.

FIG. 3C shows the input-output characteristic of an interference type optical regenerator. The transfer function between an input and an output is sinusoidal, and there is provided an intermediate characteristic between the characteristic of the linear amplifier shown in FIG. 3A and the characteristic of the ideal digital optical regenerator shown in FIG. 3B, so that noise suppression can be effected to some extent. Specifically, such an interference type optical regenerator may be configured by a Mach-Zehnder interferometer or a nonlinear optical loop mirror (NOLM) using a semiconductor optical amplifier (SOA) to be hereinafter described, for example.

FIG. 3D shows the input-output characteristic of a limiter type optical regenerator. This optical regenerator may be provided by using the gain saturation characteristic of a SOA or a distributed feedback laser diode (DFB-LD), for example. In this case, the noise only at the mark level of a signal is compressed.

FIG. 3E shows the input-output characteristic of an absorption type optical regenerator. This optical regenerator may be provided by a SOA or an electroabsorption (EA) optical modulator.

Figure 5:
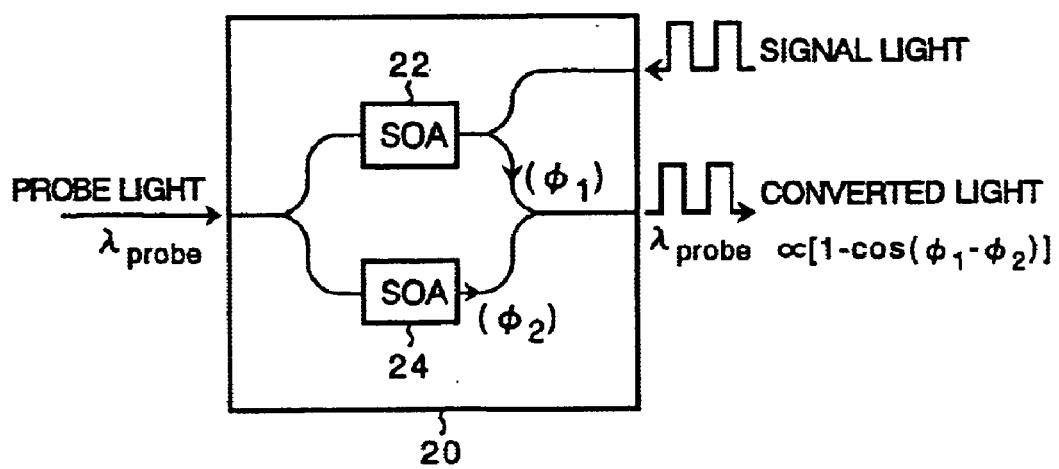
FIG. 5 is a block diagram of an optical regenerator usable in carrying out the present invention.
Figure 6:
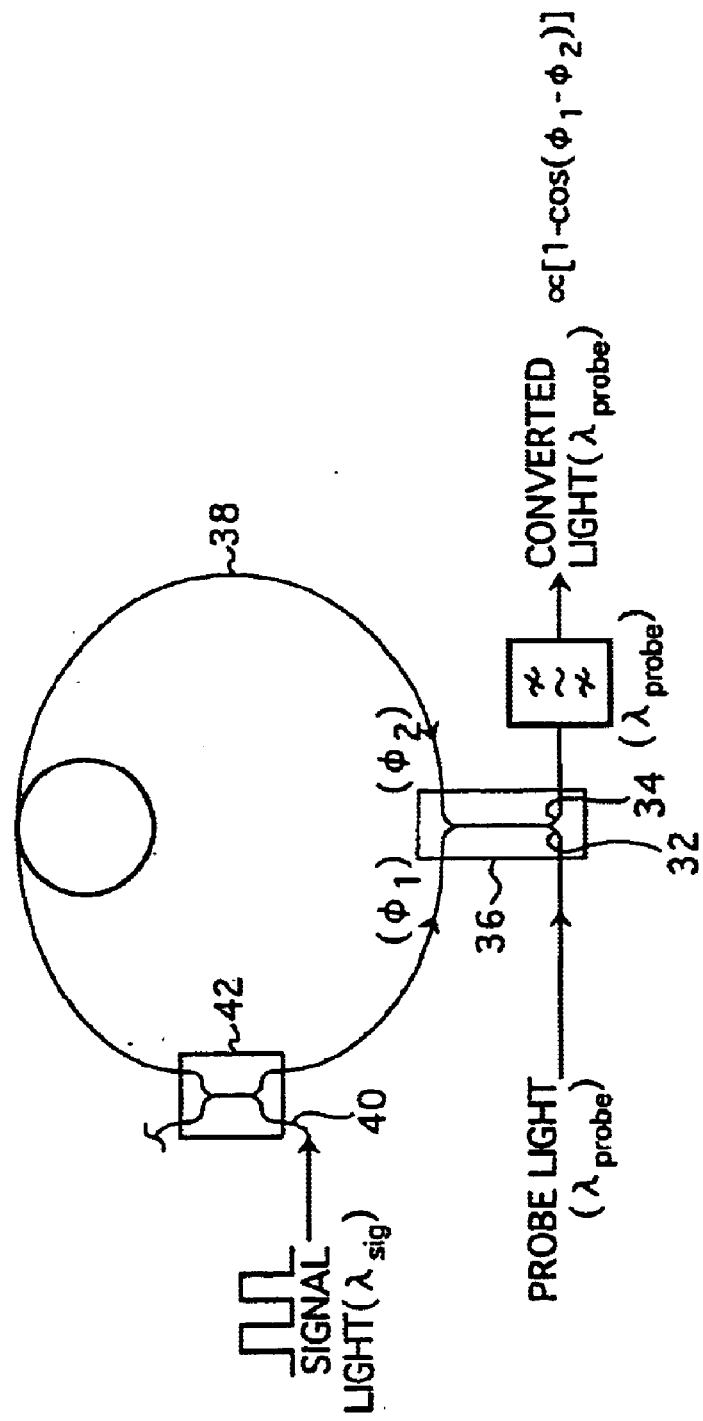
FIG. 6 is a block diagram of another optical regenerator usable in carrying out the present invention.

FIGS. 5 and 6 are block diagrams of optical regenerators usable in carrying out the present invention. FIG. 5 shows an interference type optical regenerator configured by providing two SOAs 22 and 24 on Mach-zehnder interferometer type branched optical waveguides formed on a substrate 20. FIG. 6 shows an optical regenerator configured by a NOLM. Both the optical regenerators are based on substantially the same operation principle, so the operation of the NOLM shown in FIG. 6 will now be described in detail.

This NOLM includes a first optical coupler 36 including first and second optical paths 32 and 34 directionally coupled to each other, a loop optical path 38 for connecting the first and second optical paths 32 and 34, and a second optical coupler 42 including a third optical path 40 directionally coupled to the loop optical path 38.

A part or the whole of the loop optical path 38 is provided by a nonlinear optical medium. The coupling ratio of the first optical coupler 36 is set substantially to 1:1.

The operation of this NOLM will now be described. When probe light having a wavelength λprobe is input into the first optical path 32 of the optical coupler 36 and signal light having a wavelength λsig is input into the third optical path 40 of the optical coupler 42, converted light having a wavelength λprobe is output from the second optical path 34 of the optical coupler 36. The probe light may be continuous-wave (CW) light or optical pulses.

The probe light is divided into two components having the same power by the optical coupler 36. The two components propagate in the loop optical path 38 clockwise and counterclockwise, respectively, with exactly the same optical path length, and are next subjected to a phase shift φ for each by the nonlinear optical medium. Thereafter, they are combined by the optical coupler 36. In combining these components at the optical coupler 36, they are equal in power and phase to each other, so that resultant light obtained by this combination is output from the first optical path 32 but not output from the second optical path 34 as if it is reflected by a mirror.

When signal light is input from the middle of the loop optical path 38 by the optical coupler 42, this signal light propagates in the loop optical path 38 in only one direction thereof (e.g., clockwise in FIG. 6), and the nonlinear refractive index of the nonlinear optical medium changes for the light propagating in this direction only when on-pulses pass therethrough. Accordingly, in combining the two components of the probe light at the optical coupler 36, the phases of the two components of the probe light at their portions synchronous with off-pulses of the signal light are coincident with each other, and the phases of the two components of the probe light at their portions synchronous with on-pulses of the signal light are different from each other. Letting Δφ denote a phase difference in the latter case, an output proportional to $[1-\cos(\Delta\phi)]/2$ is obtained from the second optical path 34 of the optical coupler 36.

By setting the power of the input optical signal so that the phase difference becomes π, it is possible to perform a switching operation such that the two components combined upon passing of the on-pulses are output only from the second optical path 34. Thus, the conversion from the signal light having the wavelength λ sig into the converted light having the wavelength λprobe is performed. That is, wavelength conversion is performed on the data of the signal light.

Assuming that an optical Kerr effect (cross-phase modulation (XPM) by the signal light and the probe light) is used as the nonlinear optical effect, the phase shift Δφ is proportional to γPL, where γ is the nonlinear coefficient of the nonlinear optical medium, P is the optical power in the nonlinear optical medium, and L is the length of interaction of the optical Kerr effect in the nonlinear optical medium.

A typical example of the nonlinear optical medium in the NOLM is an optical fiber. A dispersion shifted fiber (DSF) is mainly used as the optical fiber used in the NOLM, and its length is usually several km. Further, a NOLM using a SOA (semiconductor optical amplifier) as the nonlinear optical medium has also been proposed (SLALOM).

As a nonlinear optical effect applicable to optical signal processing in an optical communication system, it is considered to apply an optical Kerr effect such as three-wave mixing in a second-order nonlinear optical medium or self-phase modulation (SPM), cross-phase modulation (XPM), and four-wave mixing (FWM) in a third-order nonlinear optical medium. Examples of the second-order nonlinear optical medium include InGaAs and $LiNbO_3$. Examples of the third-order nonlinear optical medium include an optical fiber and a semiconductor medium such as a semiconductor optical amplifier (SOA) and a distributed feedback laser diode (DFB-LD).

In particular, the present invention may employ an optical Kerr effect in an optical fiber. A single-mode fiber is suitable as the optical fiber, and especially a dispersion-shifted fiber (DSF) having a relatively small chromatic dispersion is preferable.

Figure 7A:
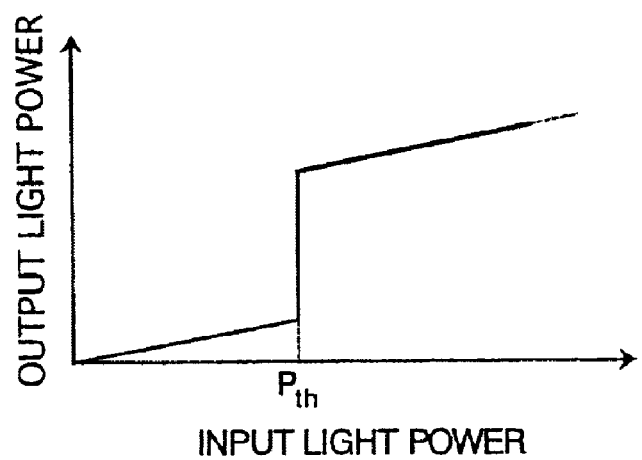
FIGS. 7A and 7B are graphs for illustrating the probability density functions (PDF) of input and output powers in a digital optical regenerator.
Figure 7B:
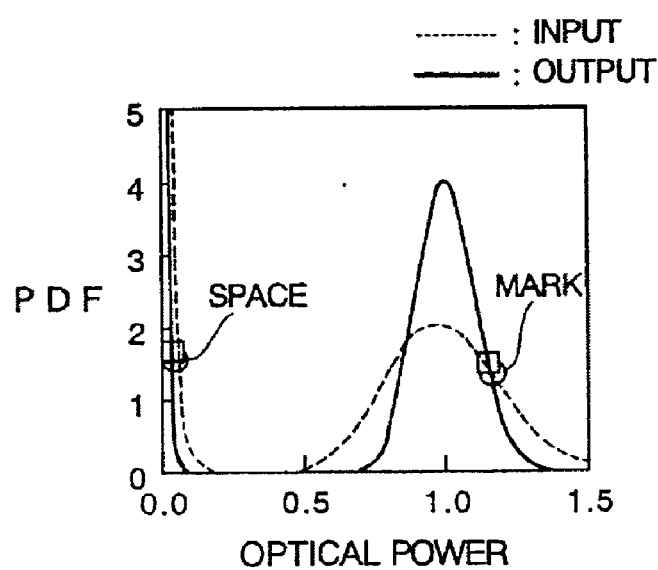

FIG. 7B shows the probability density functions (PDF) of input and output powers in a digital optical regenerator having an input-output characteristic as shown in FIG. 7A. The magnitude of an electric field of noise light is approximated by Gaussian distribution. In the digital optical regenerator, an input signal having an optical power smaller than a threshold $P_{th}$ is determined as a space, and an input signal having an optical power greater than the threshold $P_{th}$ is determined as a mark. Accordingly, in the probability density function of output power, noise is suppressed more than that in the input, so that a small-dispersion probability density is obtained. However, if the threshold $P_{th}$ is not a proper value, there may occur a problem such that a space in the input is erroneously determined as a mark in the output because of a deviation by noise or that a mark in the input is erroneously determined as a space in the output. In this case, a bit error rate is increased to degrade a signal quality. Therefore, it is important to properly set the threshold $P_{th}$ for an input signal.

Figure 8A:
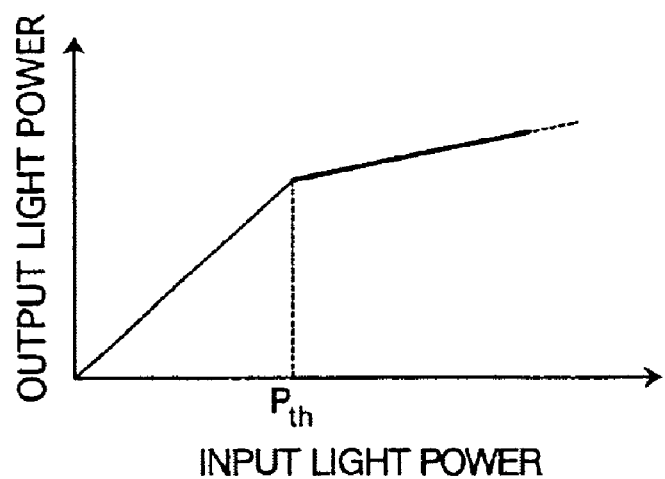
FIGS. 8A and 8B are graphs for illustrating the probability density functions (PDF) of input and output powers in a limiter type optical regenerator.
Figure 8B:
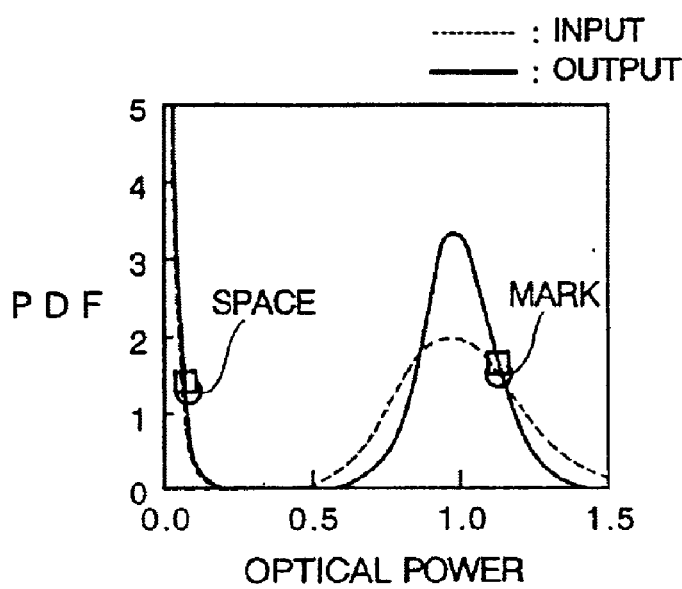

FIG. 8B shows the probability density functions (PDF) of input and output powers in a limiter type optical regenerator having an input-output characteristic as shown in FIG. 8A. The magnitude of an electric field of noise light is approximated by Gaussian distribution. In the limiter type optical regenerator, the noise only at a mark having an optical power greater than a threshold $P_{th}$ is suppressed, so that the dispersion of the probability density function of the mark is small. On the other hand, the noise at a space is not suppressed, so that the dispersion of the space becomes relatively large in association with a decrease in average level of the mark. However, a decrease in dispersion of the mark is larger than an increase in dispersion of the space, so that the Q factor of an output signal can be improved as a whole. However, if the threshold $P_{th}$ is not a proper value, it is expected that the decrease in dispersion of the mark may become smaller than the increase in dispersion of the space, and the Q factor of an output signal may become smaller than that of an input signal. Therefore, it is important to properly set the threshold $P_{th}$ for an input signal.

In the regenerator designed to discriminate in the electrical domain as shown in FIG. 4, the threshold can be easily changed by changing a reference voltage set in the discriminating circuit. However, in an optical regenerator, it is not easy to change the threshold. To cope with this problem, the present invention makes it possible to substantially change the threshold by adjusting the power of input signal light, for example. This will now be described more specifically.

Figure 9:
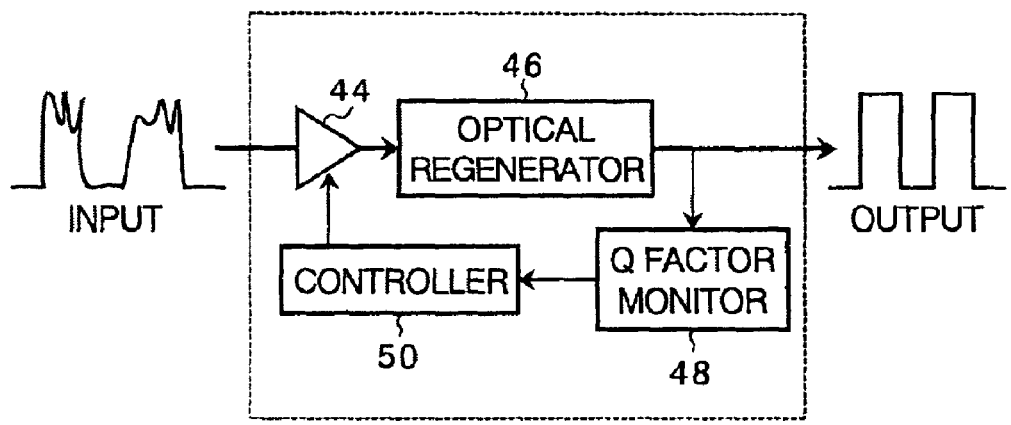
FIG. 9 is a block diagram showing a first preferred embodiment of the device according to the present invention.

FIG. 9 is a block diagram showing a first preferred embodiment of the device according to the present invention. Input signal light is amplified by an optical amplifier 44 and then supplied to an optical regenerator 46. The amplified signal light supplied to the optical regenerator 46 is waveform shaped by the optical regenerator 46, and output signal light is output therefrom. Various optical regenerators as mentioned above may be used as the optical regenerator 46. To measure the quality of the output signal light, a Q factor monitor 48 is provided. The Q factor monitor 48 receives a part of the output signal light and measures the Q factor of an electrical signal obtained according to the output signal light received. An output from the Q factor monitor 48 is supplied to a controller 50. The controller 50 controls the power of the input signal light by adjusting the gain of the optical amplifier 44 so that the Q factor measured by the Q factor monitor 48 is most improved.

With this configuration, the same effect as that by changing the threshold in the optical regenerator 46 can be obtained by changing the power of the input signal light. Accordingly, a good regenerating operation is allowed by controlling the power of the input signal light so that the quality of the output signal light (specifically, the Q factor) is improved.

Figure 10:
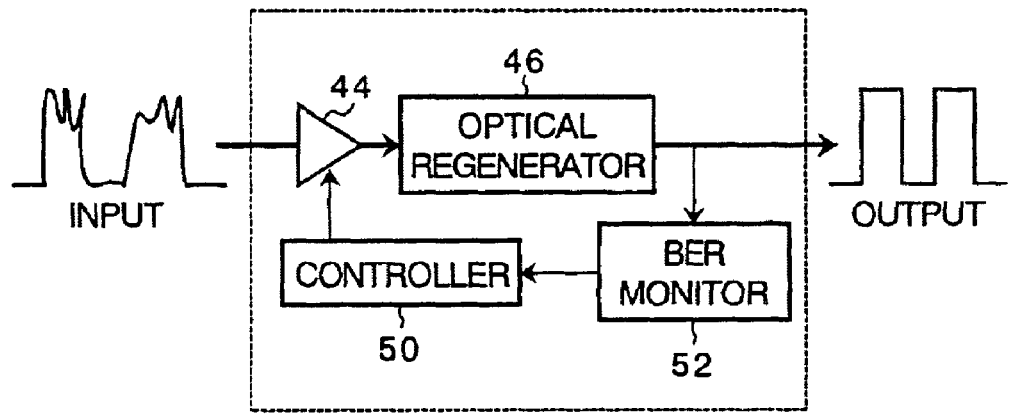
FIG. 10 is a block diagram showing a second preferred embodiment of the device according to the present invention.

FIG. 10 is a block diagram showing a second preferred embodiment of the device according to the present invention. In this preferred embodiment, a BER (bit error rate) monitor 52 is used to measure the quality of the output signal light output from the optical regenerator 46. The BER monitor 52 receives a part of the output signal light and measures the bit error rate of an electrical signal obtained according to the output signal light received. An output from the BER monitor 52 is supplied to a controller 50. The controller 50 controls the power of the input signal light by adjusting the gain of the optical amplifier 44 so that the bit error rate measured by the BER monitor 52 is minimized.

With this configuration, the same effect as that by changing the threshold in the optical regenerator 46 can be obtained by changing the power of the input signal light. Accordingly, a good regenerating operation is allowed by controlling the power of the input signal light so that the quality of the output signal light (specifically, the bit error rate) is improved.

Figure 11:
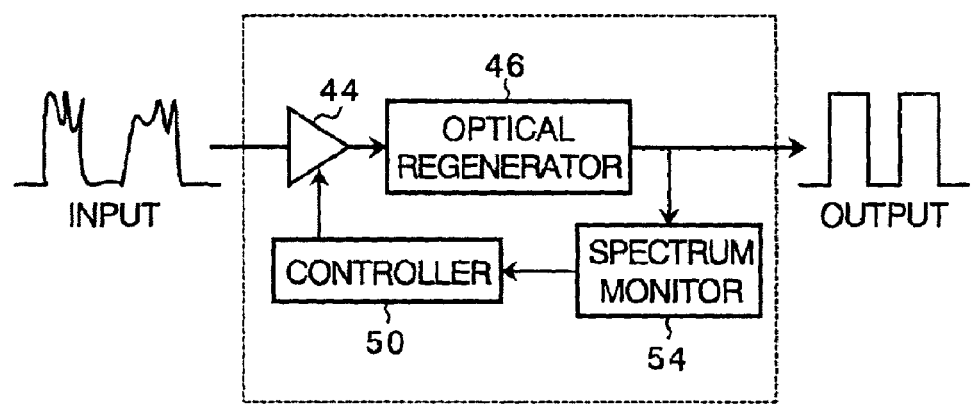
FIG. 11 is a block diagram showing a third preferred embodiment of the device according to the present invention.

FIG. 11 is a block diagram showing a third preferred embodiment of the device according to the present invention. In this preferred embodiment, a spectrum monitor 54 is used to measure the quality of the output signal light output from the optical regenerator 46. The spectrum monitor 54 receives a part of the output signal light and measures an SNR (signal-to-noise ratio) from the spectrum of the output signal light received. An output from the spectrum monitor 54 is supplied to a controller 50. The controller 50 controls the power of the input signal light by adjusting the gain of the optical amplifier 44 so that the SNR measured by the spectrum monitor 54 is most improved.

With this configuration, the same effect as that by changing the threshold in the optical regenerator 46 can be obtained by changing the power of the input signal light. Accordingly, a good regenerating operation is allowed by controlling the power of the input signal light so that the quality of the output signal light (specifically, the SNR) is improved.

A spectrum analyzer may be used as the spectrum monitor 54. In this case, the SNR can be easily measured by comparing a signal level and a noise level.

Figure 12:
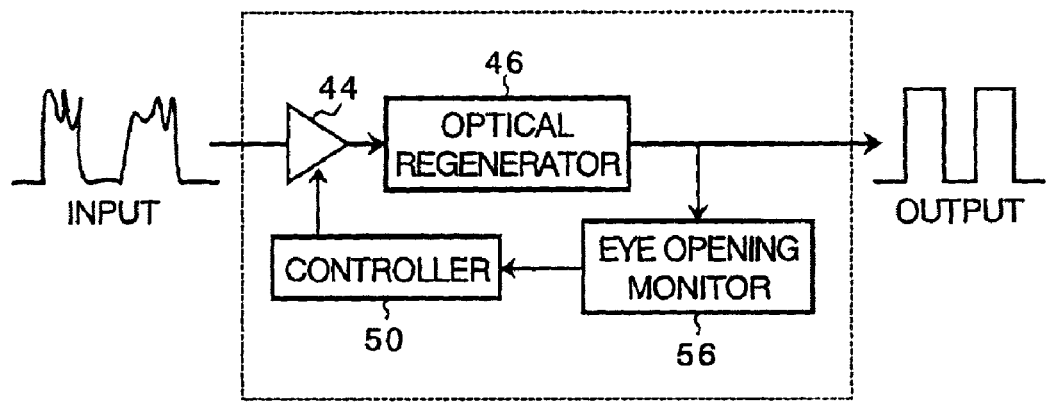
FIG. 12 is a block diagram showing a fourth preferred embodiment of the device according to the present invention.

FIG. 12 is a block diagram showing a fourth preferred embodiment of the device according to the present invention. In this preferred embodiment, an eye opening monitor 56 is used to measure the quality of the output signal light output from the optical regenerator 46. As the eye opening monitor 56, a function of observing an eye diagram as in a sampling oscilloscope may be used. The eye opening monitor 56 receives a part of the output signal light and measures the eye opening of an electrical signal waveform obtained according to the output signal light received. An output from the eye opening monitor 56 is supplied to a controller 50. The controller 50 controls the power of the input signal light by adjusting the gain of the optical amplifier 44 so that the eye opening measured by the eye opening monitor 56 is maximized.

With this configuration, the same effect as that by changing the threshold in the optical regenerator 46 can be obtained by changing the power of the input signal light. Accordingly, a good regenerating operation is allowed by controlling the power of the input signal light so that the quality of the output signal light (specifically, the eye opening) is improved.

Figure 13:
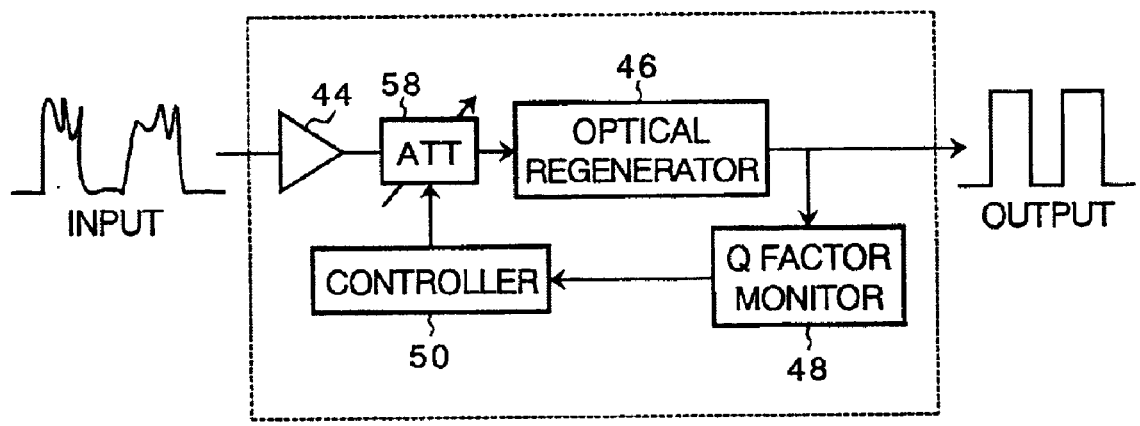
FIG. 13 is a block diagram showing a fifth preferred embodiment of the device according to the present invention.

FIG. 13 is a block diagram showing a fifth preferred embodiment of the device according to the present invention. In contrast to the preferred embodiment shown in FIG. 9, the fifth preferred embodiment is characterized in that an optical attenuator (ATT) 58 is additionally provided between the optical amplifier 44 and the optical regenerator 46.

With this configuration, the same effect as that by changing the threshold in the optical regenerator 46 can be obtained by adjusting the attenuation of the optical attenuator 58 to change the power of the input signal light. Accordingly, a good regenerating operation is allowed by controlling the power of the input signal light so that the quality of the output signal light (specifically, the Q factor) is most improved.

While the Q factor is used as the quality of the output signal light in this preferred embodiment, the control may be performed according to the BER, SNR, or eye opening instead as in the above-mentioned various preferred embodiments.

Figure 14:
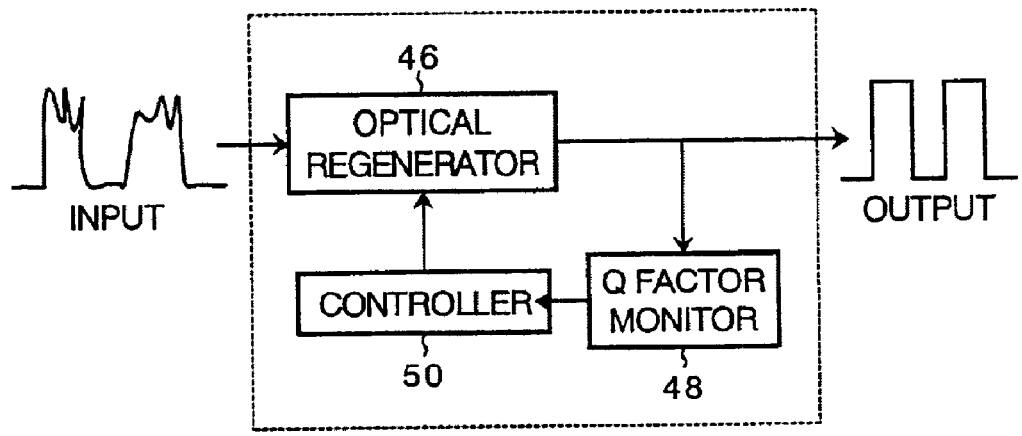
FIG. 14 is a block diagram showing a sixth preferred embodiment of the device according to the present invention.

FIG. 14 is a block diagram showing a sixth preferred embodiment of the device according to the present invention. This preferred embodiment is characterized in that the optical regenerator 46 has a variable threshold. Input signal light is supplied directly to the optical regenerator 46. The input signal light supplied is waveform shaped by the optical regenerator 46 and output signal light is output therefrom. A Q factor monitor 48 is provided to measure the quality of the output signal light. The Q factor monitor 48 receives a part of the output signal light and measures the Q factor of an electrical signal obtained according to the output signal light received. An output from the Q factor monitor 48 is supplied to a controller 50. The controller 50 controls the threshold in the optical regenerator 46 so that the Q factor measured by the Q factor monitor 48 is most improved.

Figure 15:
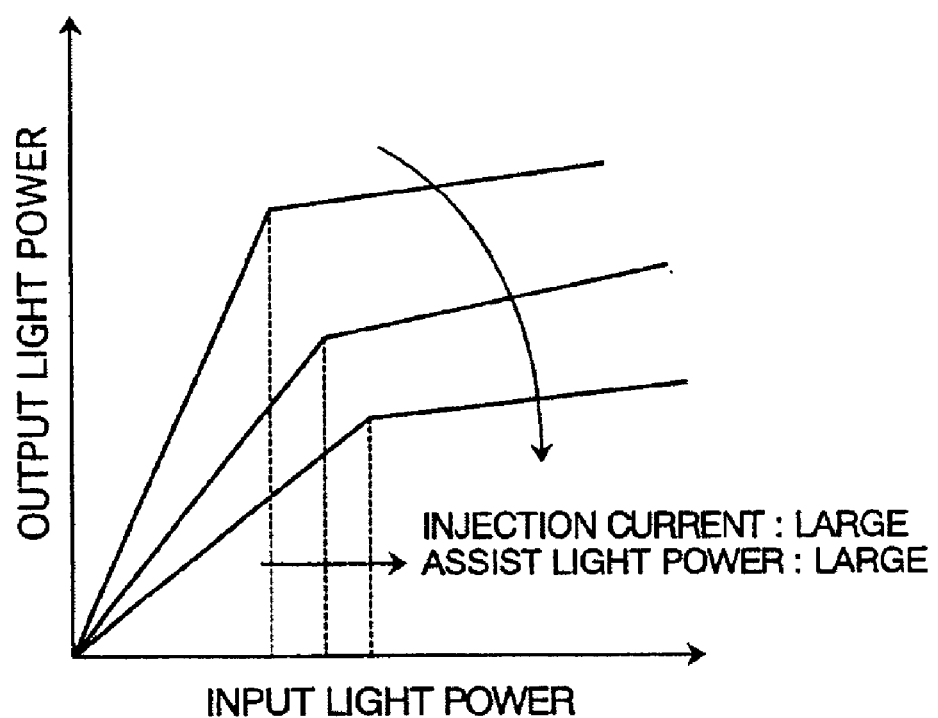
FIG. 15 is a graph showing changes in threshold etc. in the input-output characteristic of an optical regenerator according to changes in injection current and assist light power.

An optical regenerator using a SOA or a laser has been proposed, and a saturated value and a threshold in the input-output characteristic of such an optical regenerator are changed by changing an injection current to this optical regenerator as shown in FIG. 15. In accordance therewith, the noise suppression and waveform shaping characteristics of this optical regenerator are also changed. Accordingly, by operating the controller 50 to adjust the injection current to the optical regenerator 46 as in the preferred embodiment shown in FIG. 14 to thereby change the threshold in the optical regenerator 46, an optimum threshold can be set.

While the Q factor is used as the quality of the output signal light in this preferred embodiment, the control may be performed according to the BER, SNR, or eye opening instead as in the above-mentioned various preferred embodiments.

Figure 16:
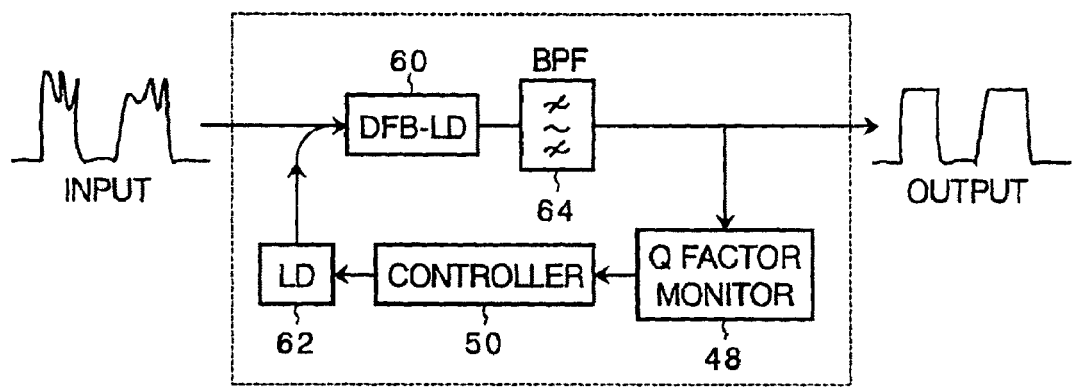
FIG. 16 is a block diagram showing a seventh preferred embodiment of the device according to the present invention.

FIG. 16 is a block diagram showing a seventh preferred embodiment of the device according to the present invention. In this preferred embodiment, a DFB-LD 60 having a variable threshold changing according to the power of assist light supplied thereto is used as the optical regenerator. The assist light is supplied from a laser diode (LD) 62 as an assist light source to the DFBLD 60. Input signal light is supplied also to the DFB-LD 60. Output signal light from the DFB-LD 60 is passed through a bandpass filter (BPF) 64, and then output from this device.

A Q factor monitor 48 is provided to measure the quality of the output signal light. The Q factor monitor 48 receives a part of the output signal light and measures the Q factor of an electrical signal obtained according to the output signal light received. An output from the Q factor monitor 48 is supplied to a controller 50. The controller 50 controls the power of the assist light by adjusting a drive current for the LD 62, for example, so that the Q factor measured by the Q factor monitor 48 is most improved.

A limiter type optical regenerator using the gain saturation of a DFB-LD has been proposed, and a saturated value and a threshold in the input-output characteristic of such an optical regenerator are changed by changing the power of assist light as continuous wave light (CW light) to this optical regenerator as shown in FIG. 15. In accordance therewith, the noise suppression and waveform shaping characteristics of this optical regenerator are also changed. Accordingly, by operating the controller 50 to adjust the power of the assist light to the DFB-LD 60 as the optical regenerator as in the preferred embodiment shown in FIG. 16 to thereby change the threshold in the DFB-LD 60, an optimum threshold can be set.

While the Q factor is used as the quality of the output signal light in this preferred embodiment, the control may be performed according to the BER, SNR, or eye opening instead as in the above-mentioned various preferred embodiments.

Figure 17:
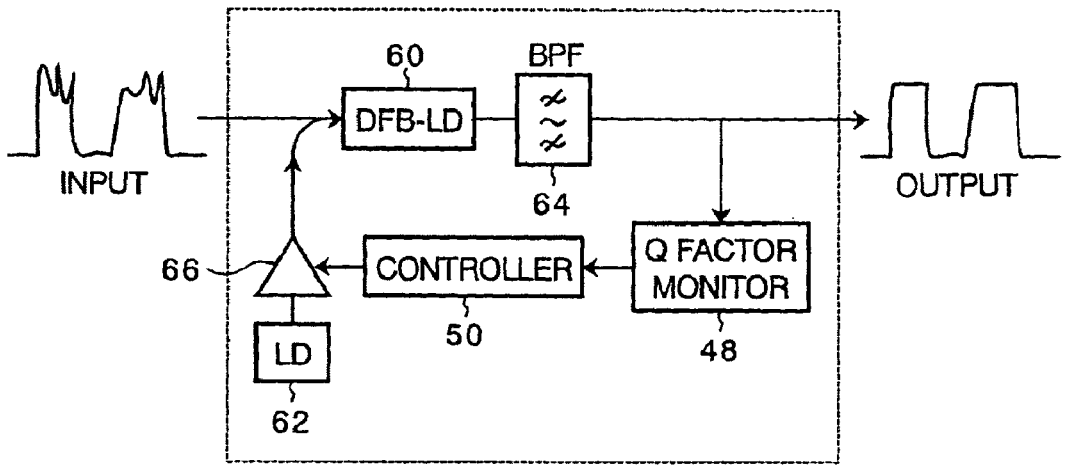
FIG. 17 is a block diagram showing an eighth preferred embodiment of the device according to the present invention.

FIG. 17 is a block diagram showing an eighth preferred embodiment of the device according to the present invention. In contrast to the preferred embodiment shown in FIG. 16, the eighth preferred embodiment is characterized in that an optical amplifier 66 is additionally provided between the LD 62 and the DFB-LD 60. Assist light output from the LD 62 is amplified by the optical amplifier 66, and then supplied to the DFB-LD 60. Accordingly, by operating the controller 50 to control the gain of the optical amplifier 66, the power of the assist light to be supplied to the DFB-LD 60 can be controlled to thereby set an optimum threshold.

FIG. 18 is a block diagram showing a ninth preferred embodiment of the device according to the present invention. In contrast to the preferred embodiment shown in FIG. 16, the ninth preferred embodiment is characterized in that an optical attenuator 68 is additionally provided between the LD 62 and the DFB-LD 60. Assist light output from the LD 62 is attenuated by the optical attenuator 68, and then supplied to the DFB-LD 60. Accordingly, by operating the controller 50 to control the attenuation of the optical attenuator 68, the power of the assist light to be supplied to the DFB-LD 60 can be controlled to thereby set an optimum threshold.

Figure 19:
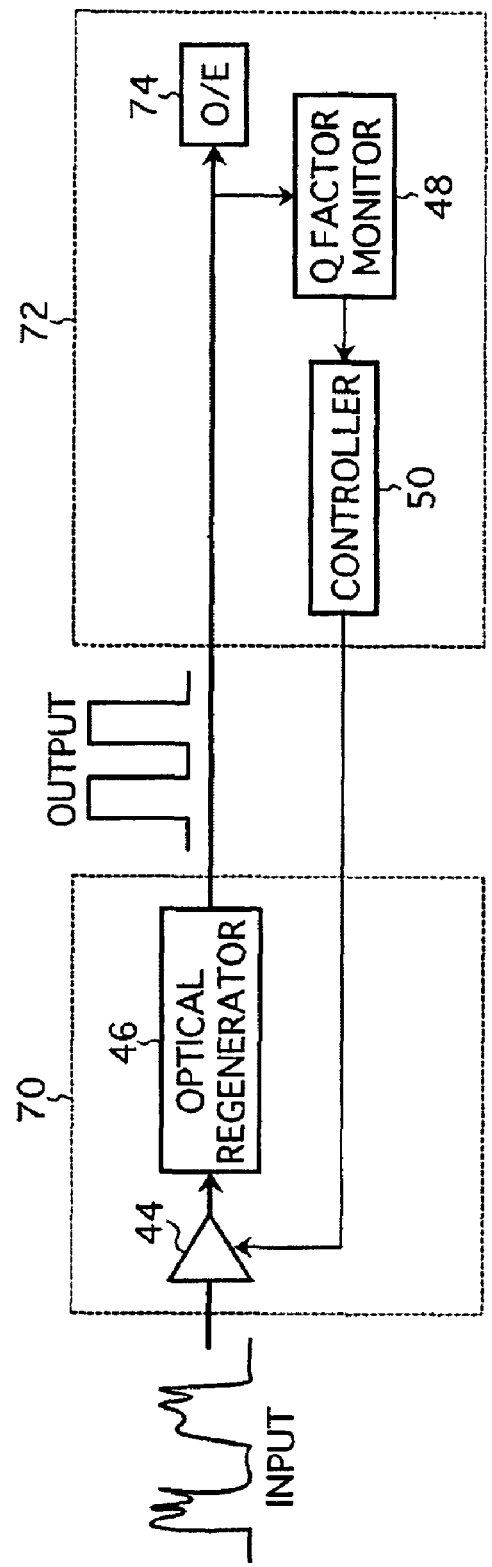
FIG. 19 is a block diagram showing a tenth preferred embodiment of the device according to the present invention.

FIG. 19 is a block diagram showing a tenth preferred embodiment of the device according to the present invention. In contrast to the preferred embodiment shown in FIG. 9 wherein the device according to the present invention is provided in one unit such as an optical repeater, the tenth preferred embodiment is characterized in that the device according to the present invention is separately provided in two units 70 and 72. That is, an optical amplifier 44 and an optical regenerator 46 are provided in the unit 70 as an optical repeater, whereas a Q factor monitor 48 and a controller 50 are provided in the unit 72 as a receiving terminal. The receiving terminal 72 includes an opto-electrical converter 74 for converting output signal light from the optical regenerator 46 into an electrical signal. According to this preferred embodiment, a regenerating operation in the optical regenerator 46 can be optimally controlled by remote-controlling the optical repeater 70 according to the quality of the signal light in the receiving terminal 72.

While the Q factor is used as the quality of the output signal light in this preferred embodiment, the control may be performed according to the BER, SNR, or eye opening instead as in the above-mentioned various preferred embodiments. Further, while the controller 50 is provided in the receiving terminal 72 in this preferred embodiment, the controller 50 may be provided in the optical repeater 70. In this case, an output from the Q factor monitor 48 is transmitted from the receiving terminal 72 to the optical repeater 70.

According to the present invention as described above, it is possible to provide a method and device for waveform shaping which can obtain a substantially optimum threshold to allow a good regenerating operation. The effects obtained by the specific preferred embodiments of the present invention have been described, so the description thereof will be omitted herein.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method comprising:
   inputting a signal light to an optical regenerator;
   shaping a waveform of the input signal light by the optical regenerator to thereby output a shaped signal light; and
   controlling a power level of the signal light input to the optical regenerator so that a quality measurement of the signal light output by the optical regenerator is improved, the quality measurement being one of a Q factor, a bit error rate, a spectrum shape and an eye opening, wherein said controlling comprises
   optically amplifying the signal light with an optical amplifier before being input to the optical regenerator, and
   adjusting gain of the optical amplifier to thereby control the power level of the signal light input to the optical regenerator.

2. A device comprising:
   an optical regenerator inputting a signal light and shaping a waveform of the input signal light to thereby output a shaped signal light; and
   a power controller controlling a power level of the signal light before the signal light is input to the optical regenerator so that a quality measurement of the signal light output by the optical regenerator is improved, the quality measurement being one of a Q factor, a bit error rate, a spectrum shape and an eye opening, wherein said power controller comprises an optical amplifier amplifying the signal light before being input to the optical regenerator, and a controller adjusting gain of the optical amplifier to thereby control the power level of the signal light.

3. A device comprising:
   an optical regenerator inputting a signal light and shaping a waveform of the input signal light to thereby output a shaped signal light; and
   a power controller controlling a power level of the signal light before the signal light is input to the optical regenerator so that a quality measurement of the signal light output by the optical regenerator is improved, the quality measurement being one of a Q factor, a bit error rate, a spectrum shape and an eye opening, wherein said power controller comprises an optical amplifier amplifying the signal light before being input to the optical regenerator, an optical attenuator attenuating the amplified signal light before being input to the optical regenerator, and a controller adjusting attenuation of the optical attenuator to thereby control the power level of the signal light.

4. A method comprising:
   providing an optical regenerator having a variable threshold for waveform shaping input signal light according to said variable threshold and thereby outputting waveform shaped signal light, the optical regenerator comprising a semiconductor optical amplifier (SOA), and the threshold being variable by changing an injection current of the SOA;
   measuring quality of said output signal light; and
   controlling said variable threshold by controlling the injection current in accordance with the measured quality so that the measured quality is improved.

5. A device comprising:
   an optical regenerator having a variable threshold for waveform shaping input signal light according to said variable threshold and outputting output signal light, the optical regenerator comprising a semiconductor optical amplifier (SOA), and the threshold being variable by changing an injection current of the SOA;
   means for measuring the quality of said output signal light; and
   a controller controlling said variable threshold by controlling the injection current in accordance with the measured quality so that the measured quality is improved.

6. The method of claim 1, wherein the signal light is a wavelength division multiplexed signal.

7. A method comprising:
   inputting signal light to an input of an optical regenerator;
   shaping a waveform of the input signal light by the optical regenerator to thereby output a shaped signal light;
   measuring a Q factor of said output signal light; and
   controlling a power level of the signal light at the input of the optical regenerator by an optical amplifier or optical attenuator positioned at the input of the optical regenerator, the power level being controlled in accordance with the measured Q factor to improve the measured Q factor.

8. A method comprising:
   inputting a signal light to an optical regenerator;
   shaping a waveform of the input signal light by the optical regenerator to thereby output a shaped signal light;
   measuring a bit error rate of said output signal light; and
   controlling a power level of the signal light before being input to the optical regenerator in accordance with the measured bit error rate to improve the measured bit error rate.

9. A method comprising:

inputting signal light to an optical regenerator;

shaping a waveform of the input signal light by the optical regenerator to thereby output a shaped signal light;

measuring a spectrum shape of said output signal light; and controlling the power of said input signal light in accordance with the measured spectrum shape to improve the measured spectrum shape, wherein the optical regenerator is one of an interference type optical regenerator and a nonlinear optical loop mirror (NOLM) optical regenerator.

10. A method comprising:

inputting a signal light to an optical regenerator;

shaping of waveform of the input signal light by the optical regenerator to thereby output a shaped signal light;

measuring an eye opening of said output signal light; and controlling a power level of said signal light before being input to the optical regenerator in accordance with the measured eye opening to improve the measured eye opening.

11. An optical repeater comprising:

an amplifier that amplifies a first signal to produce a second signal;

an attenuator that attenuates the second signal to produce a third signal;

an optical regenerator that shapes a waveform of the third signal to produce a fourth signal;

a quality monitor that measures a quality of the fourth signal; and a controller that controls the attenuator to change a power level of the third signal in accordance with the measured quality to thereby improve the measured quality of the fourth signal, wherein the first, second, third and fourth signals are optical signals.

12. A device comprising:

means for amplifying a first signal to produce a second signal;

means for attenuating the second signal to produce a third signal;

means for shaping a waveform of the third signal by an optical regenerator to produce a fourth signal;

means for monitoring a quality of the fourth signal; and means for controlling the attenuation by said means for attenuating in accordance with the monitored quality to change a power level of the third signal and thereby improve the monitored quality of the fourth signal, wherein the first, second, third and fourth signals are optical signals.

13. An apparatus comprising:

an optical regenerator inputting a signal light at an input of the optical regenerator and shaping a waveform of the input signal light to thereby output a shaped signal light;

means for measuring a Q factor of said output signal light; and means for controlling a power level of said signal light at the input of the optical regenerator by an optical amplifier or optical attenuator positioned at the input of the optical regenerator, the power level being controlled in accordance with the measured Q factor to improve the measured Q factor.

14. An apparatus comprising:

an optical regenerator inputting a signal light and shaping a waveform of the input signal light to thereby output a shaped signal light;

means for measuring a bit error rate of said output signal light; and means for controlling a power level of said signal light before being input to the optical regenerator in accordance with the measured bit error rate to improve the measured bit error rate.

15. An apparatus comprising:

an optical regenerator inputting a signal light and shaping a waveform of the input signal light to thereby output a shaped signal light;

means for measuring a spectrum shape of said output signal light; and means for controlling a power level of said input signal light in accordance with the measured spectrum shape to improve the measured spectrum shape, wherein the optical regenerator is one of an interference type optical regenerator and a nonlinear optical loop mirror (NOLM) optical regenerator.

16. An apparatus comprising:

an optical regenerator inputting a signal light and shaping a waveform of the input signal light to thereby output a shaped signal light;

means for measuring an eye opening of said output signal light; and means for controlling a power level of said signal light before being input to the optical regenerator in accordance with the measured eye opening to improve the measured eye opening.

17. A method comprising:

inputting a signal light to an optical regenerator;

shaping a waveform of the input signal light by the optical regenerator to thereby output a shaped signal light; and controlling a power level of the signal light input to the optical regenerator so that a quality measurement of the signal light output by the optical regenerator is improved, the quality measurement being one of a Q factor, a bit error rate, a spectrum shape and an eye opening, wherein said controlling comprises:

controlling gain of an optical amplifier which amplifies the input signal light, to thereby control the power level of the input signal light.

18. A method comprising:

inputting signal light to an optical regenerator;

shaping a waveform of the input signal light by the optical regenerator to thereby output a shaped signal light;

measuring a Q factor of said output signal light; and controlling a power level of the signal light input to the optical regenerator in accordance with the measured Q factor to improve the measured Q factor, wherein said controlling comprises:

controlling gain of an optical amplifier which amplifies the input signal light, to thereby control the power level of the input signal light.

19. A method comprising:

inputting a signal light to an optical regenerator;

shaping a waveform of the input signal light by the optical regenerator to thereby output a shaped signal light;

measuring a bit error rate of said output signal light; and controlling a power level of the input signal light in accordance with the measured bit error rate to improve the measured bit error rate, wherein said controlling comprises:

controlling gain of an optical amplifier which amplifies the input signal light, to thereby control the power level of the input signal light.

20. A method as in claim 9, wherein said controlling comprises:
controlling gain of an optical amplifier which amplifies the input signal light, to thereby control the power level of the input signal light.

21. A method comprising:
inputting a signal light to an optical regenerator;
shaping of waveform of the input signal light by the optical regenerator to thereby output a shaped signal light;
measuring an eye opening of said output signal light; and
controlling a power level of said input signal light in accordance with the measured eye opening to improve the measured eye opening, wherein said controlling comprises:
controlling gain of an optical amplifier which amplifies the input signal light, to thereby control the power level of the input signal light.

22. A method according to claim 1, wherein the optical regenerator is one of an interference type optical regenerator and a nonlinear optical loop mirror (NOLM) optical regenerator.

23. A device according to claim 2, wherein the optical regenerator is one of an interference type optical regenerator and a nonlinear optical loop mirror (NOLM) optical regenerator.

24. A method according to claim 7, wherein the optical regenerator is one of an interference type optical regenerator and a nonlinear optical loop mirror (NOLM) optical regenerator.

25. A method according to claim 8, wherein the optical regenerator is one of an interference type optical regenerator and a nonlinear optical loop mirror (NOLM) optical regenerator.

26. An optical repeater according to claim 11, wherein the optical regenerator is one of an interference type optical regenerator and a nonlinear optical loop mirror (NOLM) optical regenerator.

27. A device according to claim 12, wherein the optical regenerator is one of an interference type optical regenerator and a nonlinear optical loop mirror (NOLM) optical regenerator.

28. An apparatus according to claim 13, wherein the optical regenerator is one of an interference type optical regenerator and a nonlinear optical loop mirror (NOLM) optical regenerator.

29. An apparatus according to claim 14, wherein the optical regenerator is one of an interference type optical regenerator and a nonlinear optical loop mirror (NOLM) optical regenerator.

* * * * *